United States Patent [19]

Shieh et al.

[11] Patent Number: 5,751,166
[45] Date of Patent: May 12, 1998

[54] INPUT BUFFER CIRCUIT AND METHOD

[75] Inventors: Jhy-Jer Shieh, Phoenix; Dandas K. Tang, Chandler, both of Ariz.

[73] Assignee: Motorola, Inc., Schaumburg, Ill.

[21] Appl. No.: 658,040

[22] Filed: Jun. 4, 1996

[51] Int. Cl.[6] .................. H03K 19/0185; H03K 19/0948
[52] U.S. Cl. .................... 326/71; 326/34; 326/83
[58] Field of Search ................. 326/83, 86, 81, 326/68, 70–71, 31, 34, 63, 22–23; 327/333

[56] References Cited

U.S. PATENT DOCUMENTS

| | | | |
|---|---|---|---|
| 4,472,647 | 9/1984 | Allgood et al. | 326/71 |
| 4,820,937 | 4/1989 | Hsieh | 326/34 |
| 4,999,529 | 3/1991 | Morgan, Jr. et al. | 326/71 |
| 5,304,872 | 4/1994 | Avraham et al. | 326/68 |

*Primary Examiner*—Jon Santamauro
*Attorney, Agent, or Firm*—Rennie William Dover; Robert D. Atkins

[57] ABSTRACT

A method and a circuit for automatically adjusting a switching threshold of an input buffer circuit (100) to conform to an input signal $V_{IN}$ which can be from either a TTL or a CMOS logic family. A latch circuit (120) is initialized to set the switching threshold to that of one of the logic families. A level shifting circuit (130) has a switchable load which varies the switching threshold under the control of the latch circuit (120). The amplitude of the input signal $V_{IN}$ is detected in a threshold detector circuit (110). If the input signal $V_{IN}$ is a signal from the CMOS logic family, the latch circuit (120) changes state, switching the switchable load of the level shifting circuit (130) to adjust the switching threshold of the input buffer circuit (100).

22 Claims, 3 Drawing Sheets

200

INPUT BUFFER CIRCUIT AND METHOD

BACKGROUND OF THE INVENTION

The present invention relates, in general, to integrated circuits, and more particularly to input buffer circuits.

Digital integrated circuits such as application specific integrated circuits (ASICs) and field programmable gate arrays (FPGAs) often have input buffers which are capable of receiving signals produced by circuits from different logic families. These integrated circuits contain a collection of logic gates which are programmed by either the manufacturer or by a user into a particular configuration to perform a function specified in the user's application. Such applications often include circuits from more than one logic family whose output signals should be accurately received by the input buffer circuit.

The ability to receive signals from different logic families is useful because it provides flexibility in system design and allows a particular ASIC or FPGA die to be manufactured for use in a wider variety of systems. Input buffer circuits are commonly designed to respond to signals from transistor-transistor logic (TTL) or complementary metal-oxide-semiconductor (CMOS) logic families. Furthermore, in a single application some inputs may receive TTL signals while other inputs receive CMOS signals. Because the logic and switching threshold levels for a TTL circuit are different from those of a CMOS circuit, translation circuitry is often included in the input buffer to ensure compatibility with signals from either logic family.

In order to achieve the benefits of volume manufacturing, it is desirable that the same ASIC or FPGA integrated circuit be used regardless of whether the system uses TTL or CMOS logic signals. The switching threshold of the input buffer circuit is configured to conform to either TTL or CMOS specifications so that an adequate noise margin is maintained.

One approach is to provide a separate memory array which is programmed to select the desired logic levels for each input buffer. The switching threshold control circuitry is enabled according to data stored in the memory array. A disadvantage of this approach is that several memory bits are needed to program each input buffer, thereby reducing the amount of memory available for programming other system functions. A further disadvantage is that if the logic family for a particular input is changed the memory must be reprogrammed. Memory reprogramming increases the cost and reduces the flexibility of the FPGA circuit because of the difficulty in changing the configuration of the input buffer circuit.

There is a need for an input buffer circuit which can receive signals from two different logic families so that a single integrated circuit could be manufactured for use in systems having circuits from both families. It would be a further benefit if the configuration of each input buffer did not need to be stored in a memory array so that the memory array could be used to provide other system functions.

DETAILED DESCRIPTION OF THE DRAWINGS

Figure 1:
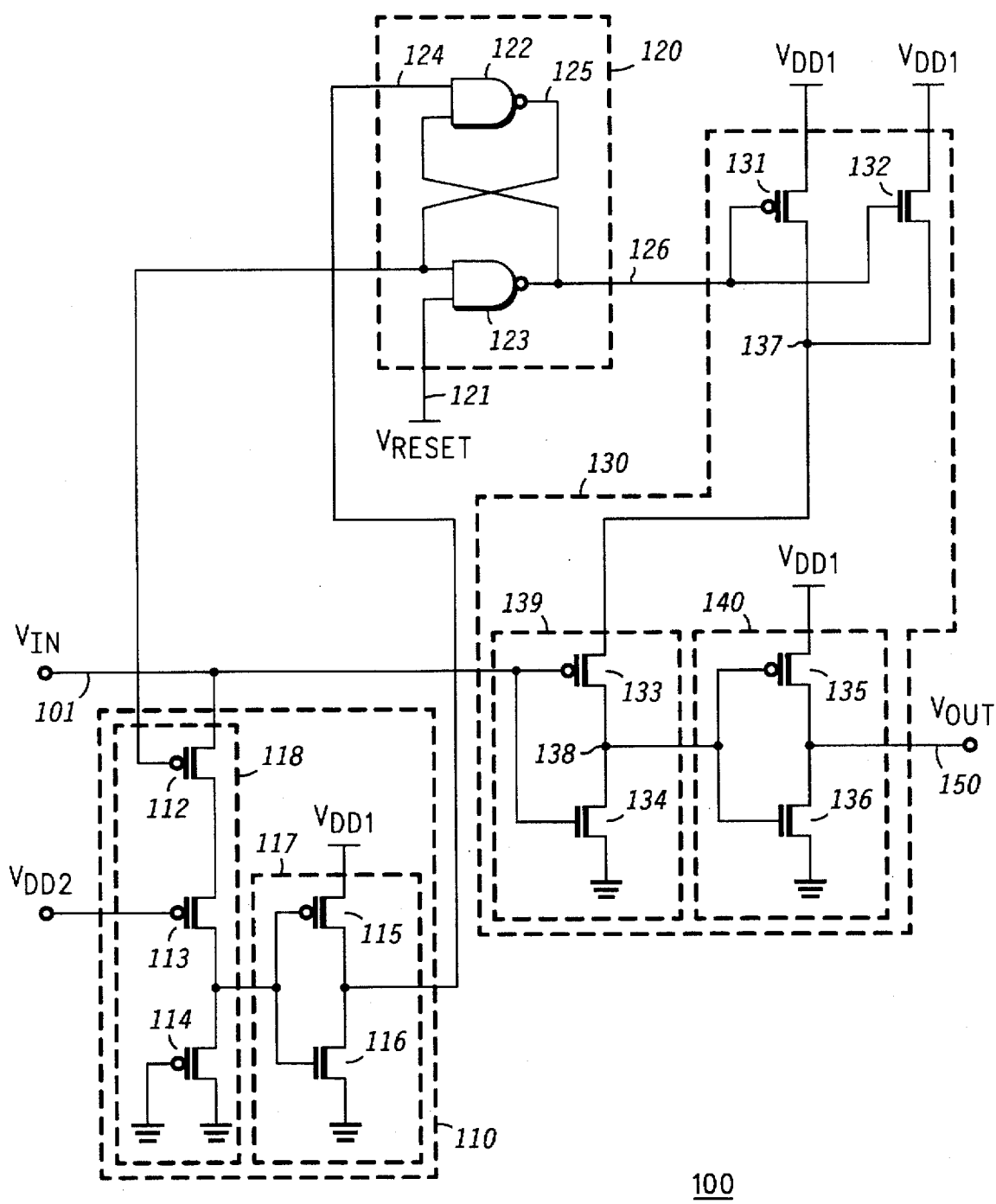
FIG. 1 is a schematic diagram of an input buffer circuit in accordance with the present invention.

Modern application specific integrated circuits (ASICs) or field programmable gate arrays (FPGAs) are integrated circuits which commonly have packages with high pin counts. Both types of circuits are comprised of unconnected logic gates which are customized to provide a particular system function. The logic gates of an ASIC are interconnected by the integrated circuit manufacturer by generating one or more interconnect layers near the end of the process. The logic function of a FPGA is controlled by a memory array which is generally programmed by the user. These devices often have as many as 400 input buffers, each of which requires an input pin for receiving input data.

ASIC and FPGA circuits are commonly used in complex systems and are expected to interface with circuits from different logic families. The most common logic families are transistor-transistor logic (TTL) and complementary metal-oxide semiconductor (CMOS) logic families. In order to preserve noise margins while receiving signals from a particular logic family, an input buffer is configured to have a switching threshold specified for that logic family.

CMOS circuits have different logic levels and switching threshold levels than TTL circuits. For example, CMOS circuits use a CMOS power supply having an upper supply level which ranges from approximately 4.5 to 5.5 volts and a lower supply level of approximately zero volts, commonly referred to as ground or ground potential. The nominal CMOS power supply voltage is 5.0 volts. The nominal switching threshold level is one-half of the CMOS power supply voltage, which is 2.5 volts when the power supply voltage is 5.0 volts. For a CMOS gate without a direct current load, a low logic level is less than 200 millivolts and a high logic level is within 200 millivolts of the CMOS power supply voltage.

In comparison, TTL circuits use a TTL power supply having an upper supply level which ranges from approximately 2.7 to 3.3 volts and a lower supply level of approximately zero volts. The nominal TTL power supply voltage is 3.0 volts. The nominal switching threshold level is 1.4 volts and ranges from 1.2 to 1.6 volts. A low logic level is less than 800 millivolts, with 200 millivolts being typical for a TTL gate having no direct current load, and a high logic level is at least 2.0 volts, with a typical voltage 700 millivolts lower than the TTL power supply voltage. A typical TTL high logic level is therefore between 2.0 and 2.6 volts, depending on the power supply voltage.

For convenience in describing the operation of the present invention, nominal values will be used. It should be appreciated that deviations from such nominal values are to be expected by one skilled in the art. Accordingly, the CMOS power supply voltage is herein referred to as 5.0 volts and the CMOS switching threshold is herein referred to as 2.5 volts. The high and low CMOS logic levels are herein referred to as 5.0 volts and zero volts, respectively. The TTL power supply voltage is herein referred to as 3.0 volts and the switching threshold is referred to as 1.4 volts. The TTL high and low logic state voltages are herein referred to as 2.3 volts and 200 millivolts, respectively.

In accordance with the present invention, a latch circuit is initially reset to a known logic state corresponding to the first of the two logic families. The output of the latch circuit controls a level shifting circuit for setting the switching threshold for the first logic family. When an input signal from the second logic family is received, it is identified as such by detecting its amplitude in a threshold detector circuit. The threshold detector circuit produces an output signal to change the state of the latch circuit, which adjusts the switching threshold level of the input buffer circuit to conform to the specification of the second logic family.

FIG. 1 is a schematic diagram of an input buffer circuit 100 in accordance with the present invention. Input buffer circuit 100 is configured to receive either TTL or CMOS input signals and to automatically adjust its switching threshold in response to those signals. Input buffer circuit 100 comprises a latch circuit 120, a threshold detector circuit 110, and a level shifting circuit 130. An input terminal 101 receives an input signal $V_{IN}$ which is either a TTL level signal or a CMOS level signal. An input terminal 121 receives a CMOS level reset signal, $V_{RESET}$, which initializes input buffer circuit 100 to a state corresponding to TTL logic signals at system power up. An output terminal 150 provides an output signal $V_{OUT}$ which is a CMOS level signal.

Latch circuit 120 is a conventional RS flip-flop comprised of a pair of cross-coupled NAND gates 122 and 123. Although shown and described as NAND gates, latch circuit 120 of the present invention is not limited to NAND gates. Alternatively, another type of logic gate such as a NOR gate can be used to implement latch circuit 120. Because of positive feedback, cross-coupled gates 122 and 123 retain their logic states. These logic states correspond to the logic family for which input buffer circuit 100 is configured.

Latch circuit 120 has an input which serves as input terminal 121 of input buffer circuit 100 and an input terminal 124 which receives a threshold output signal from threshold detector circuit 110. Latch circuit 120 is reset when reset signal $V_{RESET}$ is in the low logic state. However, if gates 122 and 123 are NOR gates rather than NAND gates, latch circuit 120 is reset when reset signal $V_{RESET}$ is in the high logic state. Reset signal $V_{RESET}$ is typically provided when power is first applied to input buffer circuit 100 and initially configures it to receive, for example, an input signal $V_{IN}$ which is a TTL compatible signal. Latch circuit 120 remains in this logic state until the input at terminal 124 receives an active low signal. Latch circuit 120 produces an enabling signal at a first output terminal 125 and a threshold adjust signal at a second output terminal 126. The enabling and threshold adjust signals are in complementary logic states. By way of example, gates 122 and 123 are CMOS gates which provide a high logic state equal to 5.0 volts and a low logic state equal to zero volts.

Level shifting circuit 130 is comprised of a variable threshold stage 139 and an output stage 140. A first input of level shifting circuit 130 is connected to terminal 126, a second input is connected to terminal 101, and an output terminal 150 provides the output signal $V_{OUT}$ of input buffer circuit 100. By way of example, transistor 131 is a P-channel metal-oxide-semiconductor (PMOS) field effect transistor and transistor 132 is a N-channel metal-oxide-semiconductor (NMOS) field effect transistor. The source electrode of transistor 131 and the drain electrode of transistor 132 are connected to a CMOS power supply voltage $V_{DD1}$ which is equal to, for example, 5.0 volts. After reset signal $V_{RESET}$ resets latch circuit 120, output terminal 126 is at a high level, e.g., five volts, and output terminal 125 is at a low level, e.g., zero volts, thereby initializing the circuit to receive TTL signals.

In the embodiment of FIG. 1, the transistors of input buffer circuit 100 have a gate-source conduction threshold $V_{TH}$ ranging from approximately 700 to 900 millivolts, with a typical gate-source conduction threshold of 800 millivolts. For purposes of describing the present invention, the conduction threshold is 800 millivolts. Accordingly, in a PMOS transistor, conduction begins when the gate electrode is at least 800 millivolts lower in voltage than the source electrode. In a NMOS transistor, conduction begins when the gate electrode is at least 800 millivolts higher in voltage than the source electrode. It should be understood that transistors typically have current carrying electrodes and control electrodes. For example, in a PMOS or NMOS transistor, the drain and source electrodes commonly serve as current carrying electrodes and the gate electrode serves as a control electrode.

Transistors 133 and 134 are serially connected between load terminal 137 and ground to form variable threshold stage 139. Input terminal 101 serves as the input terminal of variable threshold stage 139 and terminal or node 138 serves as its output terminal. Variable threshold stage 139 is similar to a standard CMOS inverter except that the source electrode of transistor 133 is connected to load terminal 137 rather than $V_{DD1}$. It should be appreciated that in a CMOS gate such as variable threshold stage 139 it is common to ratio the sizes of the PMOS and NMOS transistors to provide a desired switching threshold for the gate. By way of example, variable threshold stage 139 is designed such that PMOS transistor 133 is twice the size of NMOS transistor 134. Thus, the switching threshold is about forty percent of the voltage at load terminal 137.

PMOS transistor 131 and NMOS transistor 132 form a switchable load for variable threshold stage 139. The source electrode of transistor 131 and the drain electrode of transistor 132 are connected to CMOS power supply voltage $V_{DD1}$. The gate electrodes of transistors 131 and 132 are connected to output terminal 126 of latch circuit 120. The drain electrode of transistor 131 and source electrode of transistor 132 are commonly connected to load terminal 137. Because of the high logic signal provided at output terminal 126 of latch circuit 120, transistor 131 is turned off and transistor 132 is turned on.

Between logic transitions, when $V_{IN}$ is stable, either transistor 133 or transistor 134 is turned off so that current does not flow from load terminal 137 to ground. During transitions, however, transistors 133 and 134 are both conducting so that a path for current flow is formed from $V_{DD1}$ to ground through transistor 132. Because transistor 132 is smaller than transistor 134, the voltage divider formed among transistors 132, 133 and 134 allows the voltage on load terminal 137 to vary. By way of example, transistor 132 is one third the size of transistor 134.

Figure 2:
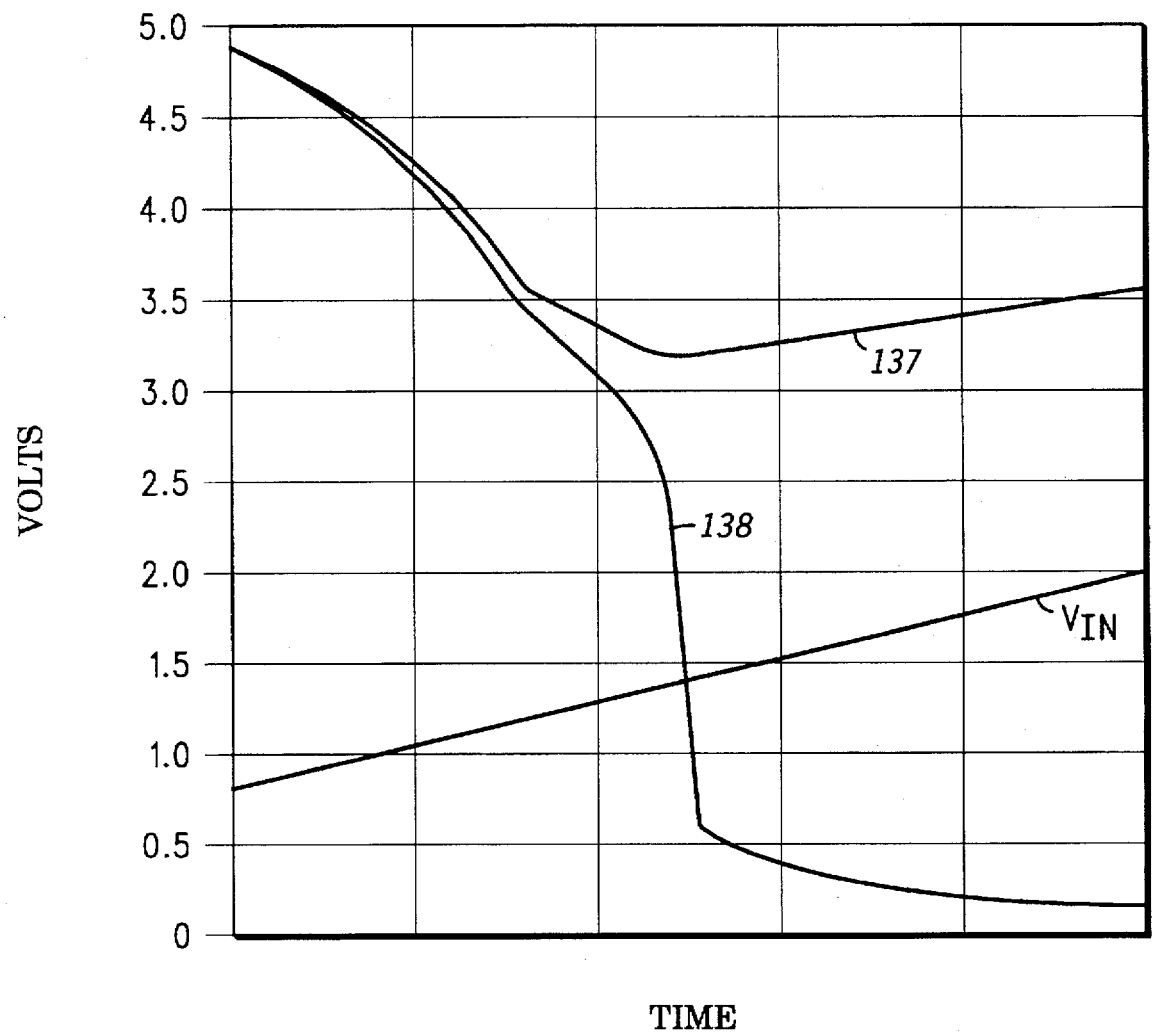
FIG. 2 is a graph of a transfer characteristic of a level shifting terminal in the input buffer circuit as the input signal transitions from a low to a high logic level.

FIG. 2 is a graph 200 of a transfer characteristic of the voltages on terminals 137 and 138 of input buffer circuit 100 of FIG. 1. Because transistors 133 and 134 are conducting, the voltage on load terminal 137 decreases as the voltage of input signal $V_{IN}$ is increased from zero to two volts. Accordingly, the voltage at terminal 138 of variable threshold stage 139 switches from high to low as input voltage $V_{IN}$ reaches 1.4 volts. Further, the voltage on load terminal 137 decreases to a minimum of about 3.2 volts when $V_{IN}$ reaches 1.4 volts. The 1.4 volt switching threshold of variable threshold stage 139 is the desired switching threshold for receiving a low to high TTL compatible input signal $V_{IN}$.

Figure 3:
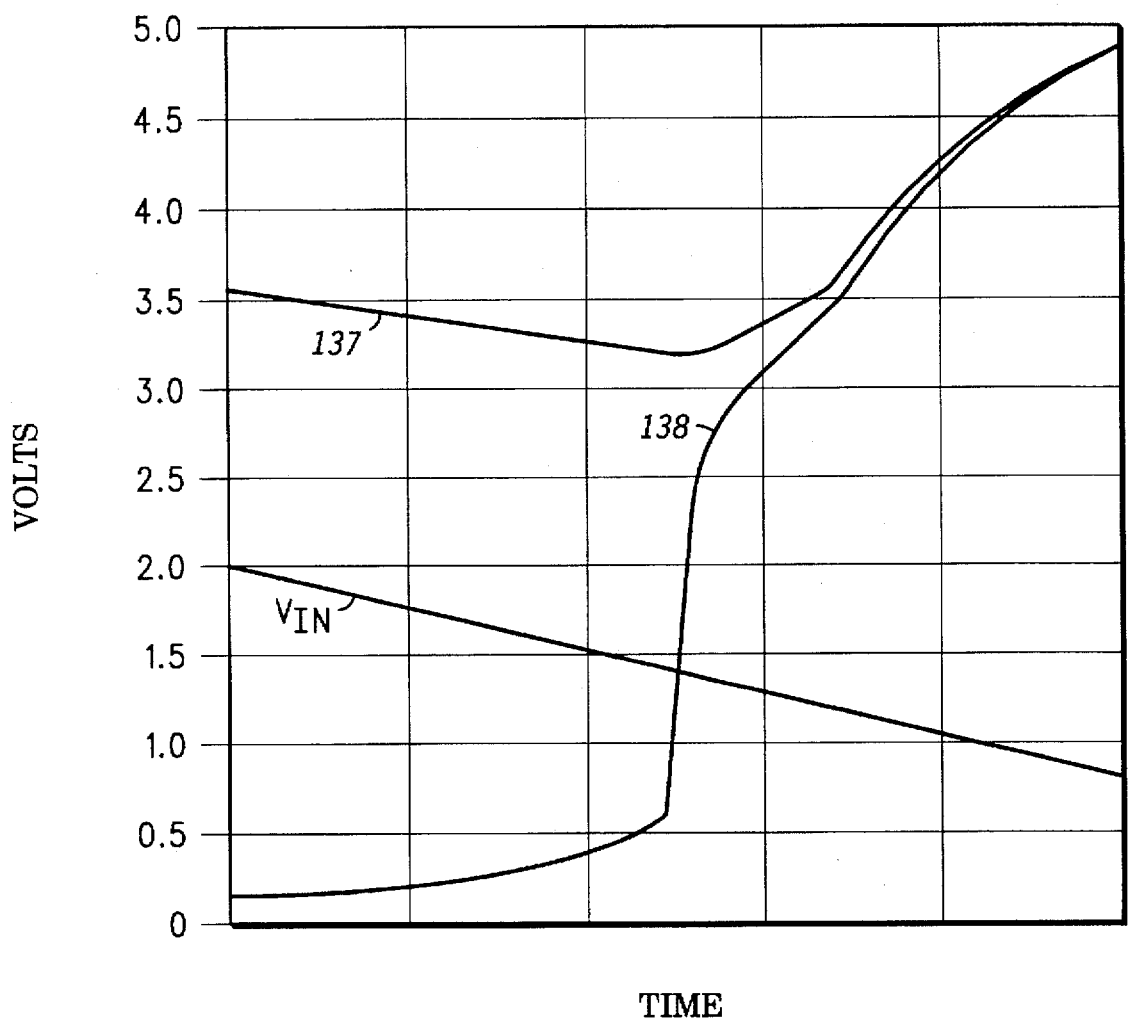
FIG. 3 is a graph of a transfer characteristic of a level shifting terminal in the input buffer circuit as the input signal transitions from a high to a low logic level.

FIG. 3 is a graph 300 of a transfer characteristic of the voltages on terminals 137 and 138 of input buffer circuit 100 of FIG. 1 as the input voltage $V_{IN}$ is decreased from two volts to zero volts. When $V_{IN}$ is reduced, the voltage on load terminal 137 is also reduced because transistors 133 and 134 are both conducting. The output voltage at terminal 138 of variable threshold stage 139 switches from low to high as the input voltage $V_{IN}$ reaches 1.4 volts, i.e., the desired TTL switching threshold. Further, the voltage on load terminal 137 decreases to about 3.2 volts.

Output stage 140 is configured as a conventional CMOS inverter serially connected between power supply voltage $V_{DD1}$ and ground and is comprised of, for example, PMOS transistor 135 and NMOS transistor 136. The respective drains of transistors 135 and 136 are connected in common and serve as output terminal 150 which provides an output signal, $V_{OUT}$, for input buffer circuit 100. Output signal $V_{OUT}$ conforms to the CMOS logic levels of five volts for a high and zero volts for a low.

Threshold detector circuit 110 senses whether input signal $V_{IN}$ is a CMOS signal. It is comprised of a switchable voltage divider 118 and a buffer stage 117. Threshold detector circuit 110 has an input terminal 101 which serves as the input terminal of input buffer circuit 100, and an output terminal 124. By way of example, a three volt TTL power supply voltage $V_{DD2}$ is applied at the gate electrode of transistor 113, and serves as a reference signal for detecting whether $V_{IN}$ is a CMOS signal.

Switchable voltage divider 118 has a first input connected to terminal 101, a second input connected to terminal 125 and a third input connected to TTL power supply voltage $V_{DD2}$. Switchable voltage divider 118 is comprised of PMOS transistors 112, 113 and 114. The source electrode of transistor 112 serves as input terminal 101 and the drain electrode is connected to the source electrode of transistor 113. The gate electrode of transistor 112 serves as the second input of switchable voltage divider 118. The drain electrode of transistor 113 is connected to the source electrode of transistor 114, whose drain and gate electrodes are connected to ground potential. The source electrode of transistor 114 serves as the output of switchable voltage divider 118.

Buffer stage 117 is comprised of PMOS transistor 115 and NMOS transistor 116, which are serially connected between $V_{DD1}$ and ground to form a conventional CMOS inverter. The gates of transistors 115 and 116 are commonly connected to form an input of buffer stage 117. The input of buffer stage 117 is connected to the output of switchable voltage divider 118. Transistors 115 and 116 are ratioed such that the switching threshold at the input of buffer stage 117 is set to be approximately 1.4 volts. By way of example, this switching threshold is achieved by scaling NMOS transistor 116 to be four times the size of PMOS transistor 115. Output terminal 124 serves as the output of threshold detector circuit 110.

If either transistor 112 or transistor 113 is turned off, current does not flow through transistor 114, so that the voltage at the input of buffer stage 117 is low and the voltage at terminal 124 is high. Thus, latch circuit 120 does not change state in response to the logic high appearing on terminal 124. Current flows through switchable voltage divider 118 when two conditions are met. First, the voltage on the gate electrode of transistor 112 is held low by the voltage appearing at terminal 125, thereby enabling transistor 112. This occurs after a reset signal $V_{RESET}$ and remains in this state as long as input buffer circuit 100 is in the mode for receiving TTL signals.

Second, input signal $V_{IN}$ is greater than 3.8 volts in amplitude in order to overcome the conduction threshold of transistor 113, whose gate electrode is at $V_{DD2}$. The second condition is met when input signal $V_{IN}$ is a CMOS signal in a high logic state because a TTL signal does not exceed three volts. When input signal $V_{IN}$ is greater than 3.8 volts, current flows through switchable voltage divider 118 and the voltage at the input of buffer stage 117 rises. When the voltage at the input of buffer stage 117 reaches 1.4 volts, the threshold output signal at terminal 124 of buffer stage 117 switches from a logic high level to a logic low level and sets latch circuit 120 to the opposite state. The changed state of the latch circuit 120 is an indication that input signal $V_{IN}$ is a CMOS signal and that the switching threshold of input buffer circuit 100 should be adjusted accordingly. The voltage at terminal 125 changes from a low logic level to a high logic level, thereby driving the gate electrode of transistor 112 high and turning off transistor 112. As a result, the current path from input terminal 101 to ground through switchable voltage divider 118 is shut off, thereby preventing current loading on input terminal 101.

Recall that transistors 131 and 132 form a switchable load for variable threshold stage 139 in the sense that the load resistance at terminal 137 changes according to which of the transistors 131 and 132 is enabled. In the embodiment shown in FIG. 1, when input buffer circuit 100 is in the TTL mode, the high logic level at terminal 126 turns off transistor 131 and turns on transistor 132. When latch circuit 120 changes state, the voltage at terminal 126 drives the gate electrodes of transistors 131 and 132 to a low logic level, turning on transistor 131 and turning off transistor 132.

Transistor 131 is substantially larger than transistor 132 such that when transistor 131 is enabled a lower load resistance is presented at load terminal 137, thereby lowering the amount by which the voltage on load terminal 137 decreases during logic level transitions. When transistor 131 is enabled the voltage on load terminal 137 is reduced by less than approximately 200 millivolts. This is in contrast to the condition where transistor 132 is enabled and the voltage on load terminal 137 is reduced to 3.2 volts at the switch point of variable threshold stage 139. Thus, the voltage on load terminal 137 remains within the limits of a CMOS power supply voltage so that the switching threshold of the variable threshold stage 139 is approximately 2.5 volts, the CMOS switching threshold.

In an alternative embodiment, transistor 132 is replaced with a resistor or other load element which provides a load resistance from load terminal 137 and power supply voltage $V_{DD1}$. The resistance of the alternative load element is chosen such that when input buffer circuit 100 is in the TTL mode, the voltage on load terminal 137 is reduced to 3.2 volts during logic level transitions of input signal $V_{IN}$. It should be noted that when the alternative load element is not a transistor, there is no need for a control electrode because a resistive load is always enabled. Transistor 131 is controlled as before by the voltage on terminal 126. When input signal $V_{IN}$ is a CMOS signal, transistor 131 is enabled to form a parallel load with the alternative load element, thereby reducing the load resistance at load terminal 137. Transistor 131 is designed such that when input buffer circuit 100 is in the CMOS mode the voltage on load terminal 137 is reduced less than 200 millivolts during logic level transitions of input signal $V_{IN}$. Input buffer circuit 100 is thereby automatically set to the switching threshold for receiving a CMOS input signal.

By now it should be appreciated that an input buffer circuit and a method have been provided which is capable of receiving an input signal from different logic families without sacrificing noise margins. The input buffer circuit does not require a preprogrammed memory array because the switching threshold is automatically adjusted to be compatible with the logic family of the input signal. The input buffer circuit described herein is readily integrated on a semiconductor die.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, although the embodiment described herein is comprised of transistors which are either PMOS or NMOS transistors, other embodiments comprising different combinations of PMOS and NMOS transistors are known or may occur to those skilled in the art. Similarly, embodiments will occur to those skilled in the art which use bipolar transistors, junction field effect transistors, or other electrical components, either separately or in combination with PMOS and NMOS transistors.

We claim:

1. An input buffer circuit having an input, an output and a variable switching threshold, the input being responsive to an input signal and the output providing an output signal, comprising:

a threshold detector circuit having first, second and third inputs, wherein the first input is responsive to the input signal, the second input is responsive to a reference signal, the third input is responsive to an enabling signal, and the output provides a threshold output signal;

a latch circuit having first and second inputs and first and second outputs, the first input being responsive to a reset signal, the second input being responsive to the threshold output signal, the first output providing the enabling signal, and the second output providing a threshold adjust signal; and a level shifting circuit having first and second inputs and an output, wherein the first input is responsive to the input signal of the input buffer circuit, the second input is responsive to the threshold adjust signal, and the output is coupled to the output of the input buffer circuit.

2. The input buffer circuit of claim 1, wherein the threshold detector circuit further comprises:

a switchable voltage divider having first, second and third inputs, and an output, the first input being responsive to the input signal of the input buffer circuit, the second input being responsive to the reference signal, and the third input being responsive to the enabling signal; and a buffer stage having an input coupled to the output of the switchable voltage divider circuit and an output for providing the threshold output signal.

3. The input buffer circuit of claim 1, wherein the level shifting circuit further comprises:

a variable threshold stage having an input, an output, and a load terminal, the input being responsive to the input signal of the input buffer circuit; and a switchable load having first and second terminals, the first terminal being responsive to the threshold adjust signal and the second terminal being coupled to the load terminal of the variable threshold stage, wherein the switchable load provides a first resistance when the threshold adjust signal is at a first logic level and a second resistance when the threshold adjust signal is at a second logic level.

4. The input buffer circuit of claim 3, wherein the switchable load further comprises:

a first transistor having first and second current carrying electrodes and a control electrode, wherein the first current carrying electrode is coupled for receiving a power supply voltage, the second current carrying electrode is coupled to the load terminal of the variable threshold stage, and the control electrode is responsive to the threshold adjust signal; and a second transistor having first and second current carrying electrodes and a control electrode, wherein the first current carrying electrode is coupled for receiving the power supply voltage, the second current carrying electrode is coupled to the load terminal of the variable threshold stage and the control electrode is responsive to the threshold adjust signal.

5. The input buffer circuit of claim 4, wherein the first transistor is a P-channel metal-oxide-semiconductor field effect transistor and the second transistor is a N-channel metal-oxide-semiconductor field effect transistor.

6. The input buffer circuit of claim 4, wherein the first transistor is a N-channel metal-oxide-semiconductor field effect transistor and the second transistor is a P-channel metal-oxide-semiconductor field effect transistor.

7. The input buffer circuit of claim 4, wherein the first transistor is responsive to a transistor-transistor logic compatible input signal and the second transistor is responsive to a complementary metal-oxide-semiconductor compatible input signal.

8. The input buffer circuit of claim 3, further comprising an output stage having an input and an output, the input being coupled to the output of the variable threshold stage and the output serving as the output of the input buffer circuit.

9. The input buffer circuit of claim 8, wherein the input buffer circuit is a monolithic integrated circuit.

10. An integrated circuit having an input, an output and a switching threshold, the switching threshold adjustable from a transistor-transistor logic (TTL) switching threshold to a complementary metal-oxide-semiconductor (CMOS) switching threshold, comprising:

a latch circuit having first and second inputs and first and second outputs, the first input coupled for receiving a reset signal;

a threshold detector circuit having first, second, and third inputs and an output, the first input coupled for receiving an input signal, the second input coupled for receiving a reference signal, the third input coupled to the first output of the latch circuit, and the output coupled to the second input of the latch circuit;

a variable threshold stage having an input, a load terminal and an output, wherein the input is coupled to the input of the integrated circuit and the output is coupled to the output of the integrated circuit; and a switchable load having first and second terminals and a control input, wherein the second terminal is coupled to the load terminal of the variable threshold stage and the control input is coupled to the second output of the latch circuit.

11. The integrated circuit of claim 10, wherein the switchable load further comprises:

a load element having first and second electrodes, the first electrode coupled for receiving a power supply voltage and the second electrode coupled to the load terminal of the variable threshold stage; and a transistor having first and second current carrying electrodes and a control electrode, the first current carrying electrode coupled for receiving the power supply voltage, the second current carrying electrode coupled to the load terminal of the variable threshold stage and the control electrode responsive to the threshold adjust signal, wherein the switching threshold of the integrated circuit corresponds to the CMOS switching threshold when the transistor is enabled.

12. The integrated circuit of claim 11, wherein the load element comprises a transistor, the transistor having first and second current carrying electrodes and a control electrode, wherein the first and second current carrying electrodes respectively serve as the first and second electrodes of the load element and the control electrode is responsive to the threshold adjust signal.

13. The integrated circuit of claim 12, wherein the threshold detector circuit further comprises:

a switchable voltage divider having first, second and third inputs and an output, the first, second and third inputs serving as the first, second and third inputs of the threshold detector circuit, respectively; and a buffer stage having an input and an output, the input being coupled to the output of the switchable voltage divider and the output serving as the output of the threshold detector circuit.

14. The integrated circuit of claim 13, wherein the switchable voltage divider further comprises:

a first transistor having first and second current carrying electrodes and a control electrode, the first current carrying electrode serving as the first input of the threshold detector circuit and the control electrode serving as the third input of the threshold detector circuit;

a second transistor having first and second current carrying electrodes and a control electrode, the first current carrying electrode coupled to the second current carrying electrode of the first transistor, the second current carrying electrode coupled to the output of the threshold detector circuit and the control electrode serving as the second input of the threshold detector circuit; and a third transistor having first and second current carrying electrodes and a control electrode, the first current carrying electrode coupled to the second current carrying electrode of the second transistor, and the second current carrying electrode and the control electrode coupled to a ground potential.

15. The integrated circuit of claim 10, further comprising an output stage having an input and an output, the input coupled to the output of the variable threshold stage and the output serving as the output of the integrated circuit.

16. A method of altering a switching threshold of a circuit, comprising the steps of:

applying an input signal to an input of the circuit;

comparing the input signal to a reference signal to produce a threshold output signal; and varying a resistance with the threshold output signal to alter the switching threshold at the input of the circuit.

17. The method of claim 16, further comprising the step of setting the resistance to an initial value.

18. The method of claim 17, wherein the step of varying the resistance includes the step of reducing the resistance from the initial value.

19. The method of claim 16, wherein the step of varying a resistance includes the step of increasing the switching threshold when the input signal exceeds the reference signal in amplitude.

20. The method of claim 19, further comprising the steps of:

storing a value of the threshold output signal to produce an enable signal; and activating the reference signal with the enable signal.

21. An integrated circuit, comprising:

a threshold detector circuit having a first input coupled for receiving an input signal, a second input coupled for receiving a reference signal, and an output for comparing the input signal with the reference signal to provide a threshold output signal;

a variable threshold stage having an input coupled to the first input of the threshold detector circuit and an output for providing an output signal; and a variable resistor coupled between a power supply conductor and the variable threshold stage for providing a resistance determined by the threshold output signal to set a switching threshold at the input of the variable threshold stage.

22. The integrated circuit of claim 21, further comprising a latch having an input coupled to the output of the threshold detector circuit and an output coupled to an enable input of the threshold detector circuit to activate the reference signal.

* * * * *